United States Patent
Grudowski et al.

(10) Patent No.: US 7,687,354 B2
(45) Date of Patent: Mar. 30, 2010

(54) FABRICATION OF A SEMICONDUCTOR DEVICE WITH STRESSOR

(75) Inventors: Paul A. Grudowski, Austin, TX (US); Veeraraghavan Dhandapani, Round Rock, TX (US); Stefan Zollner, Hopewell Junction, NY (US)

(73) Assignee: Freescale Semiconductor, Inc., Austin, TX (US)

(*) Notice: Subject to any disclaimer, the term of this patent is extended or adjusted under 35 U.S.C. 154(b) by 13 days.

(21) Appl. No.: 12/040,394

(22) Filed: Feb. 29, 2008

(65) Prior Publication Data
US 2009/0221119 A1   Sep. 3, 2009

(51) Int. Cl.
*H01L 21/336* (2006.01)
(52) U.S. Cl. .............................. 438/282; 257/E29.063
(58) Field of Classification Search ................ 438/282; 257/E29.063
See application file for complete search history.

(56) References Cited

U.S. PATENT DOCUMENTS

| 7,037,770 B2* | 5/2006 | Chidambarrao et al. ...... 438/154 |
| 2004/0262694 A1 | 12/2004 | Chidambaram |
| 2005/0029619 A1* | 2/2005 | Forbes ........................ 257/516 |
| 2006/0228842 A1 | 10/2006 | Zhang et al. |

* cited by examiner

*Primary Examiner*—Matthew Smith
*Assistant Examiner*—Walter H Swanson
(74) *Attorney, Agent, or Firm*—James L. Clingan, Jr.; Susan C. Hill (57) ABSTRACT

In a semiconductor fabrication process, an epitaxial layer is formed overlying a substrate, wherein there is a lattice mismatch between the epitaxial layer and the substrate. A hard mask having an opening is formed overlying the epitaxial layer. A recess is formed through the epitaxial layer and into the substrate. The recess is substantially aligned to the opening in the hard mask. A channel region of a semiconductor device is formed in the recess.

20 Claims, 7 Drawing Sheets

FABRICATION OF A SEMICONDUCTOR DEVICE WITH STRESSOR

BACKGROUND

1. Field

This disclosure relates generally to semiconductor devices, and more specifically, to semiconductor devices that have a stressor.

2. Related Art

Semiconductor devices have been found to have improved performance by including one or more stressors. The additional stress improves performance by increasing carrier mobility. For example, adding compressive stress to the channel of a P channel transistor has been shown to improve its performance. Similarly, adding tensile stress to the channel of an N channel transistor has been found to improve its performance. The stressor types can be categorized as those that are formed over the transistor features such as over the source/drains and/or gates and those that are embedded. The embedded types are typically at least part of the source/drains where stress can be applied to the channel. Although the desirability of embedded stressors is known, the methods of achieving them can result in problems or less stress than should be possible. For example, stress can be achieved using silicon/germanium and silicon/carbon lattice structures in conjunction with lattice structures that are just silicon. The amount of stress can generally be increased by increasing the concentration of the germanium or the carbon. This, however, can be difficult to achieve and the problems with germanium and carbon are not necessarily the same.

Accordingly it is desirable to provide a method for achieving embedded stressors that overcome or improve upon one or more of these issues.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, an embedded stressor is formed by first depositing a high quality silicon/carbon layer, which is in-situ doped with phosphorus or arsenic, by epitaxial growth over a silicon substrate. The high quality silicon carbon layer can be formed with very few defects at the interface to the silicon because the silicon layer is planar. By being planar there is only one surface plane, typically (0,0,1), a process for silicon/carbon can be optimized for that particular surface plane. In such case the silicon/carbon layer can have a relatively high carbon concentration while still retaining low defectivity. An opening is then formed through the silicon/carbon layer and into the underlying silicon substrate. Epitaxial silicon is then grown from the silicon substrate up past the silicon carbon layer for forming a channel. A gate dielectric is then formed at the top surface of the epitaxial silicon. A mask for forming the opening is retained so that an inlaid process may be used in forming a gate over the gate dielectric. The mask is removed leaving a gate over a silicon channel with silicon/carbon source/drains as stressors. A sidewall spacer is then formed around the gate for providing a mask for forming heavily-doped portions of the source/drains. One approach for forming the heavily-doped regions is simply to perform an implant. Another is to form recesses, which are aligned to the sidewall spacer, into the silicon/carbon layer and the silicon substrate and then filling them with epitaxial silicon/carbon to increase the stress on the channel. This is better understood by reference to the following description and the drawings.

Figure 1:
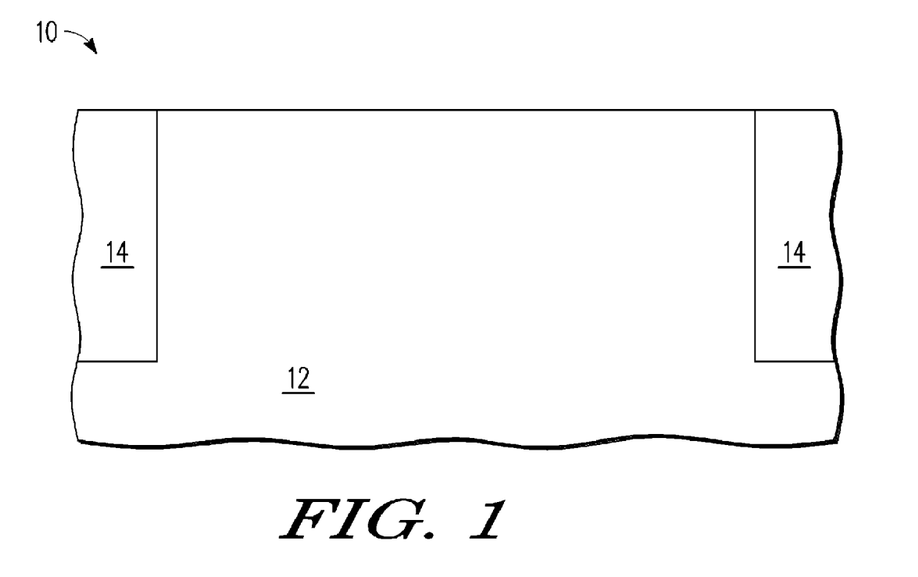
FIG. 1 is a cross section of a semiconductor device at a stage in processing according to an embodiment.

Shown in FIG. 1, in cross section, is a semiconductor device 10 comprising a substrate 12 and isolation 14 surrounding a portion of substrate 12. The portion of a substrate that is surrounded by isolation is often called an active region. Substrate 12 is preferably silicon. Other materials may also be found to be effective. Substrate 12 is shown as being bulk silicon but could also be silicon on insulator (SOI). Isolation 14 may be of the type commonly formed, especially what is often referenced as shallow trench isolation (STI).

Figure 2:
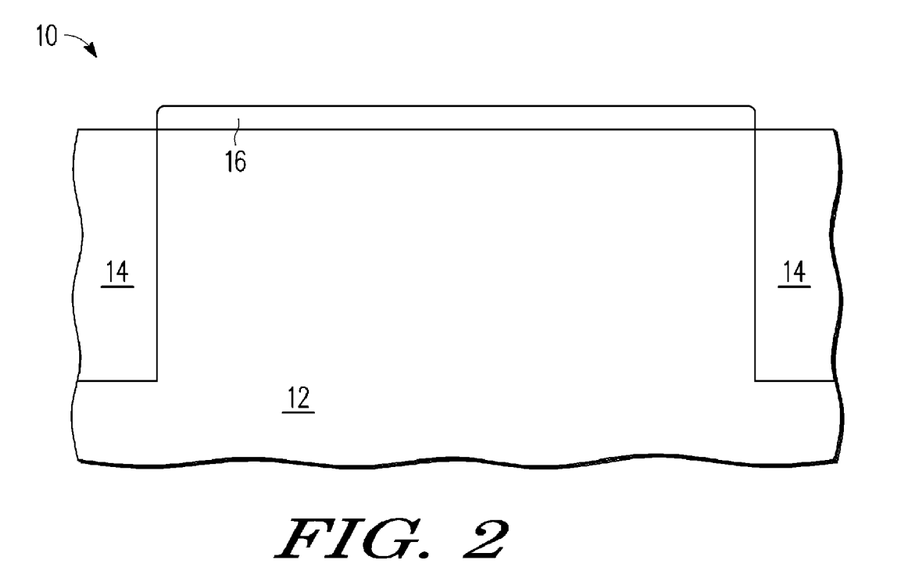
FIG. 2 is a cross section of the semiconductor device of FIG. 1 at a subsequent stage in processing.

Shown in FIG. 2 is semiconductor device 10 after epitaxially growing a silicon/carbon layer 16 directly on a top surface of substrate 12. Silicon/carbon layer 16 is preferably about 300 Angstroms thick. The top surface of a silicon substrate that is commonly available has a surface plane of (0,0,1). The process that is used for epitaxially growing silicon/carbon layer 16 is optimized for the surface plane of silicon substrate 12. The result is that defects at the interface between silicon/carbon layer and substrate 12 are kept low while achieving a relatively high concentration of carbon in silicon/carbon layer 16. An example of an effective process for forming silicon/carbon layer 16 is a chemical vapor deposition process performed by flowing a silicon precursor (Silane, dichlorosilane, purified trisilane, or other Si precursor) and a carbon precursor (e.g. Monomethyl silane diluted with hydrogen) at an elevated temperature (e.g. 400-700 C) at 20 Torr to atmospheric pressure. Layer 16 is preferably in situ doped with an impurity (e.g. N-type dopants such as phosphorus, arsenic, or antimony or P-type dopants such as boron, aluminum, gallium, or indium) by flowing a precursor (phosphine, arsine, diborane) with the silicon and carbon precursors. Prior to growing layer 16, the top surface of substrate 12 may be subjected to wet and thermal preparation processes to improve epitaxial growth. Silicon/carbon layer 16 could be formed before isolation region 14 but would result in silicon/carbon layer 16 being subjected to more thermal cycling which could dislodge carbon atoms from the lattice and into interstitial sites which adversely impacts the stress. Thus, it is considered preferable to form silicon/carbon 16 after forming isolation 14.

Figure 3:
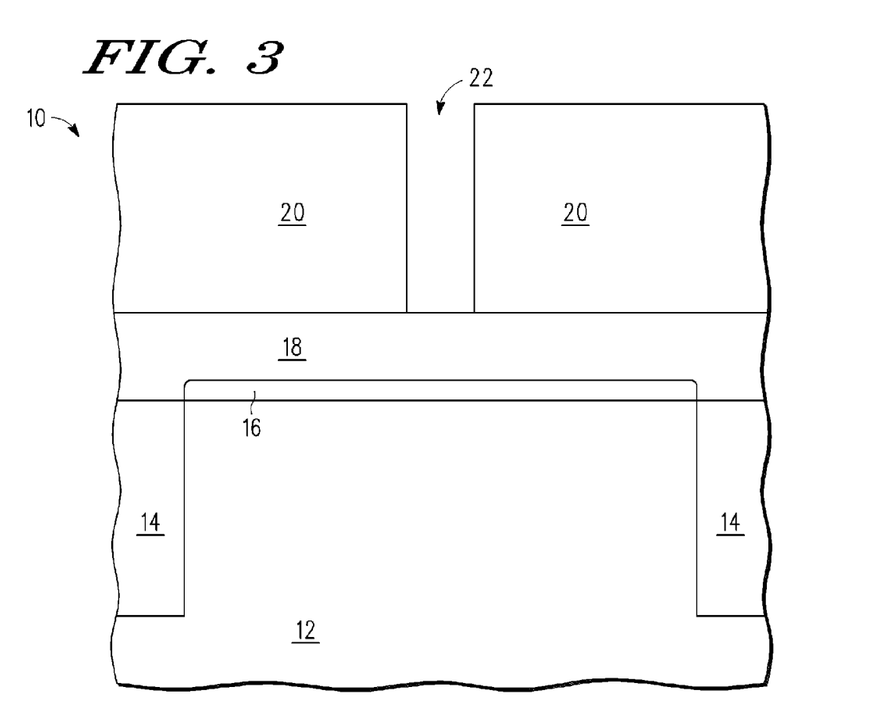
FIG. 3 is a cross section of the semiconductor device of FIG. 2 at a subsequent stage in processing.

Shown in FIG. 3 is semiconductor device 10 after forming a hard mask layer 18 and depositing a photoresist layer 20 over hard mask layer 18. Photoresist layer 20 is patterned to form an opening 22 through to hard mask layer 18. Opening 22, which may also be called a recess, is for use in determining a channel length of a transistor that is being formed. A width of 32 nanometers (nm) for opening 22 may be used for advanced processes at this time. Hard mask layer 18 may be nitride and have a thickness of about 1000 Angstroms. This choice of material for hard mask 18 is based on etchability with regard to silicon and silicon/carbon as well as being able to withstand subsequent depositions of gate material and chemical mechanical polishing (CMP).

Figure 4:
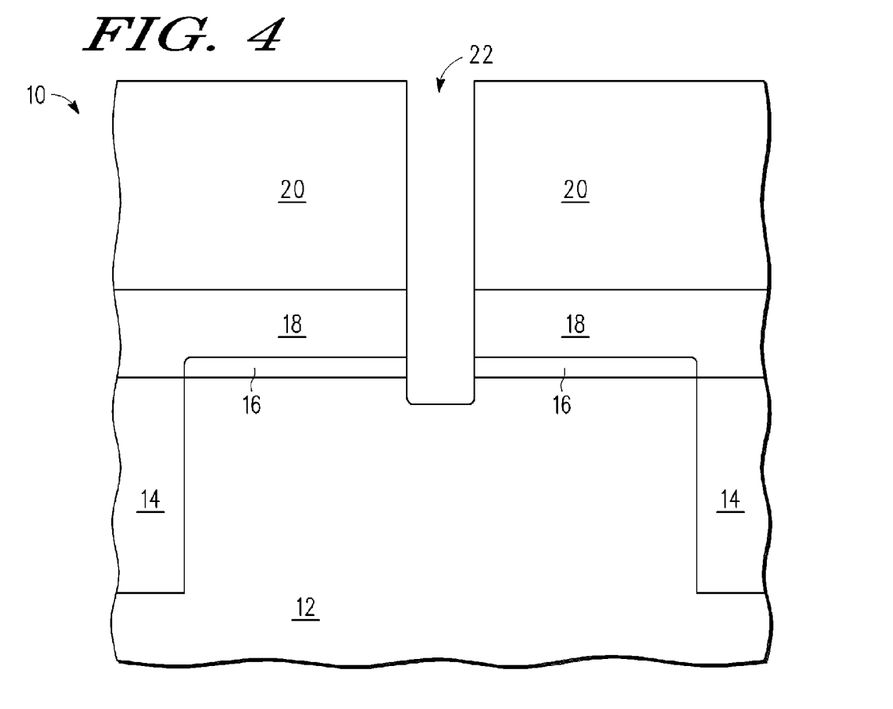
FIG. 4 is a cross section of the semiconductor device of FIG. 3 at a subsequent stage in processing.

Shown in FIG. 4 is semiconductor device 10 after performing an etch to extend opening 22 through hard mask layer 18, silicon/carbon layer 16, and into substrate 12. The depth of opening 22 into substrate 12 may be about the same as the thickness of silicon/carbon layer 16. This etch may not even need a change in chemistry after opening 22 has extended to silicon/carbon layer 16 and then substrate 12. One etchant that is effective for this purpose is a dry etch made up of hydrogen bromine (HBr) and chlorine ($Cl_2$).

Figure 5:
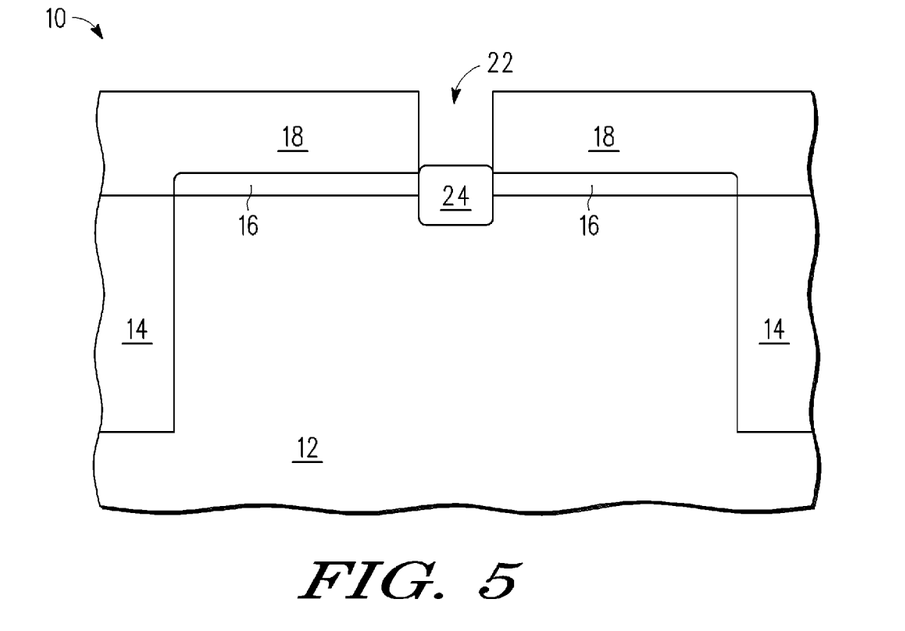
FIG. 5 is a cross section of the semiconductor device of FIG. 4 at a subsequent stage in processing.

Shown in FIG. 5 is semiconductor device 10 after epitaxially growing a silicon region 24 from the bottom of opening 22 and along the sides of opening 22 below and including silicon/carbon layer 16. Silicon region 24 is grown using standard epitaxial processes for silicon region 24 to be of high quality and to a thickness a slight amount above the top of silicon/carbon layer 16. Desired dopant levels may be included in the epitaxial growth to achieve the desired channel doping. For this example of silicon/carbon layer 16, an N channel transistor is being formed so that the background doping of the channel is preferably P-type so that silicon region 24 is in-situ doped during its growth with boron. The doping concentration can be altered during the growth to achieve the desired doping profile. Also other dopants can be added, especially at the lower portion of opening 22, to assist with improving transistor characteristics such as punch-through.

Figure 6:
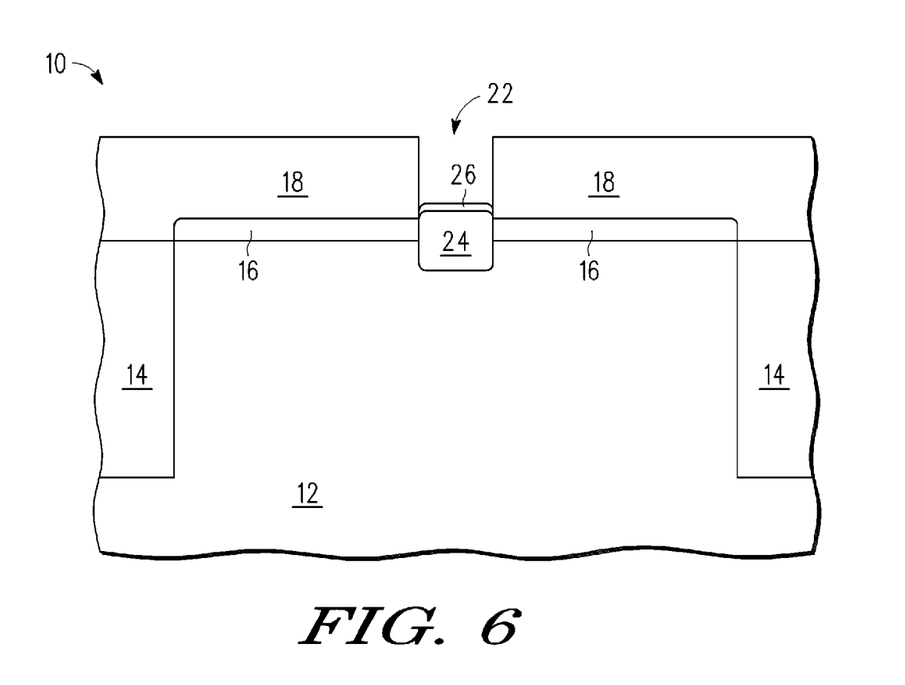
FIG. 6 is a cross section of the semiconductor device of FIG. 5 at a subsequent stage in processing.

Shown in FIG. 6 is semiconductor device 10 after forming a gate dielectric 26 on silicon region 24. The most common gate dielectric remains silicon oxide. In such case gate dielectric 26 may be grown as oxide and may be quite thin, such as less than 20 Angstroms. On the other hand, a different material such as a material having a high dielectric constant (high k dielectric) may be chosen which would be achieved by a deposition to a thickness greater than that of growing oxide. This would likely result in the high k dielectric also being on the sidewall of opening 22 and over hard mask 18 which is not shown in FIG. 6.

Figure 7:
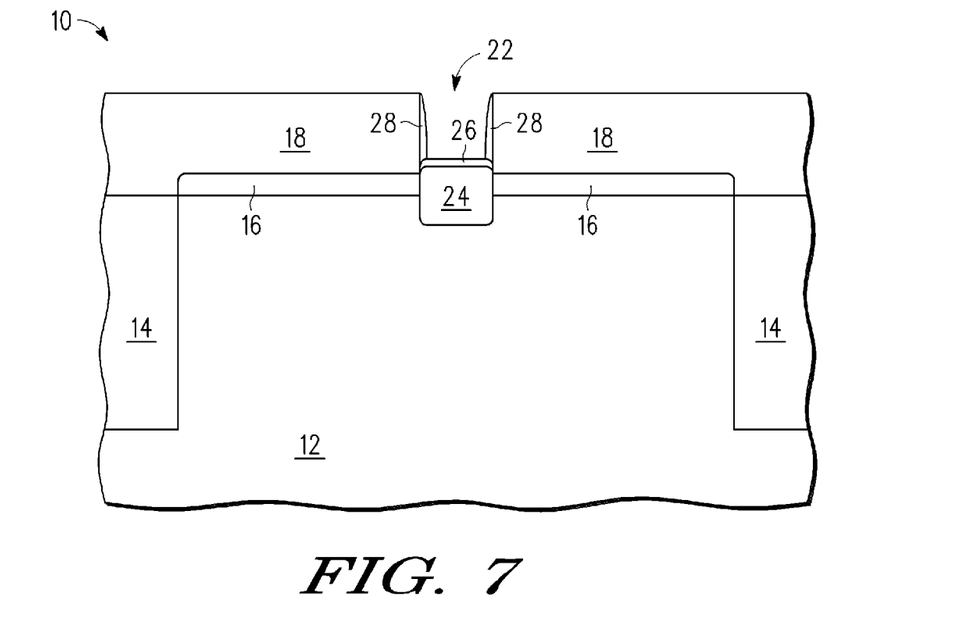
FIG. 7 is a cross section of the semiconductor device of FIG. 6 at a subsequent stage in processing.

Shown in FIG. 7 is semiconductor device 10 after forming a sidewall spacer 28 along the sidewall of opening 22. Sidewall spacer is preferably a different material than hard mask 18. In the example of hard mask 18 being nitride, sidewall spacer 28 may be oxide. Similarly, if hard mask 18 is chosen to be oxide, sidewall spacer 28 may be nitride. Sidewall spacer may be about 40 Angstroms thick at the bottom at the interface with gate dielectric 26. Sidewall spacer 28 may be called an offset spacer.

Figure 8:
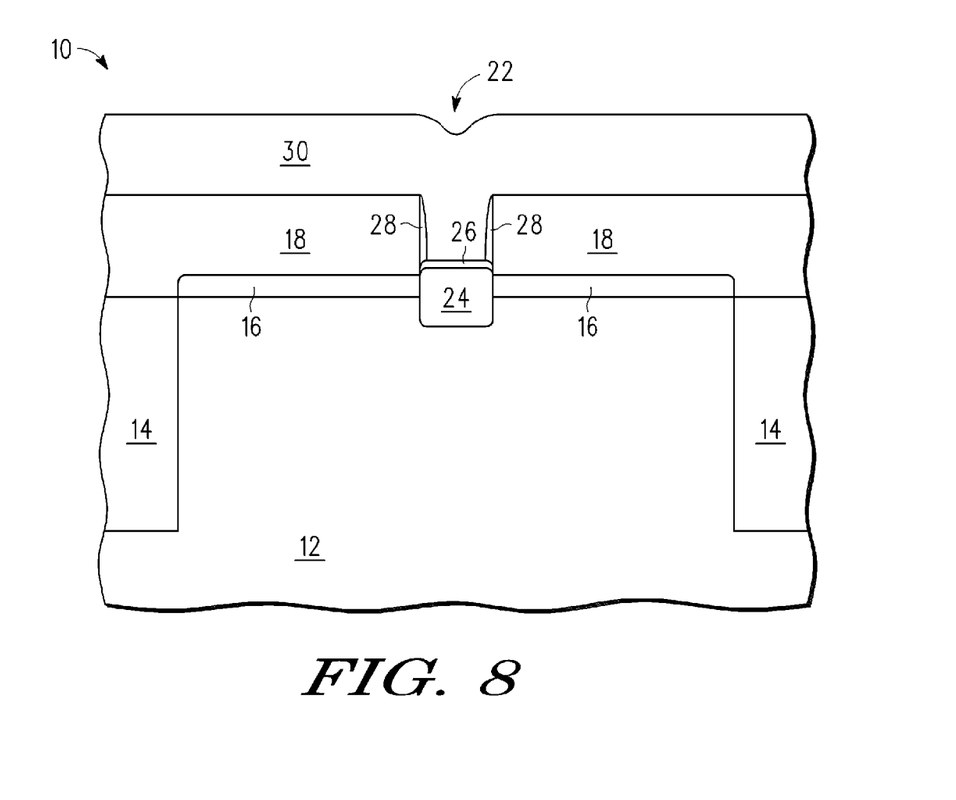
FIG. 8 is a cross section of the semiconductor device of FIG. 7 at a subsequent stage in processing.

Shown in FIG. 8 is semiconductor device 10 after depositing a conductor layer 30 in opening 22 and over hard mask 18. Conductor layer 30 is for use as a gate and thus is chosen to be of a composition appropriate for a gate. One possible material is polysilicon with appropriate doping impurities. Another possibility is a composite of two or more layers such as a metal layer with an overlying polysilicon layer. The approach of two or more layers would be more likely for the case where the gate dielectric is chosen to be a high k dielectric. The thickness of conductor layer 30 may be about the same as the thickness of hard mask layer 18. This ensures that opening 22 is completely filled with some substantial margin for subsequent processing.

Figure 9:
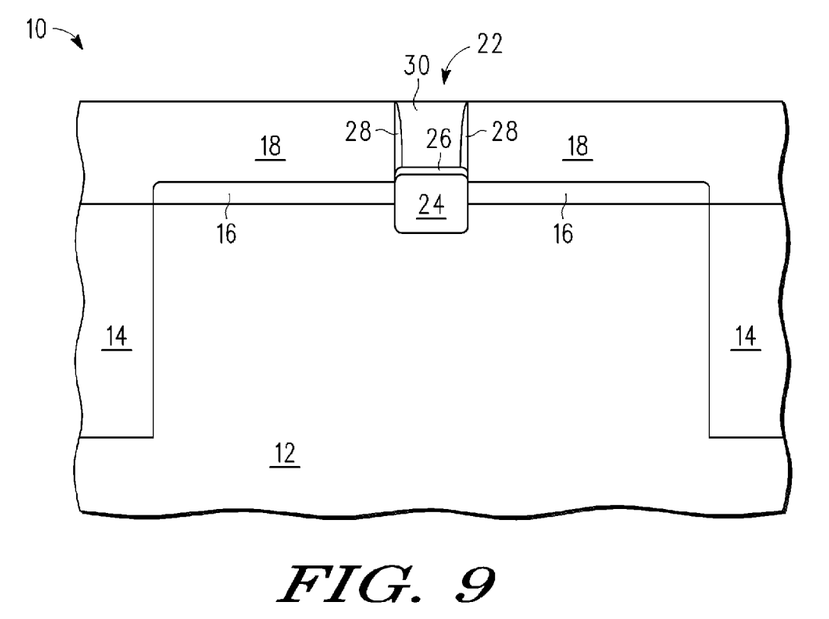
FIG. 9 is a cross section of the semiconductor device of FIG. 8 at a subsequent stage in processing.

Shown in FIG. 9 is semiconductor device 10 after a step of chemical mechanical polishing (CMP). The remaining portion of conductor layer 30 is thus contained within opening 22 and has a top surface coplanar with the top surface of hard mask 18. The remaining portion of conductor layer 30 as shown in FIG. 9 may also be called gate 30 in light of its intended function. Hard mask 18 would have some small amount of reduction in thickness due to CMP.

Figure 10:
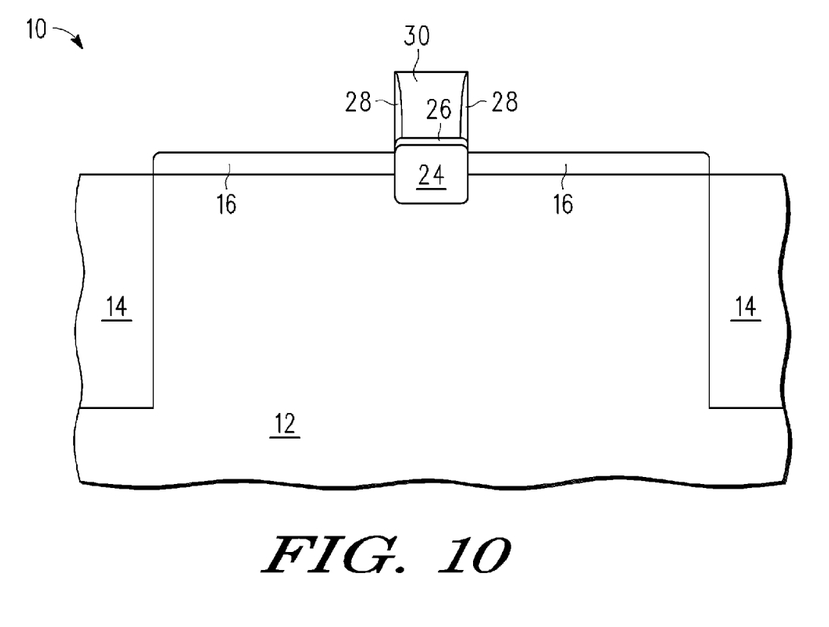
FIG. 10 is a cross section of the semiconductor device of FIG. 9 at a subsequent stage in processing.

Shown in FIG. 10 is semiconductor device 10 after removing hard mask 18. This removal is preferably by an etchant that is selective between sidewall spacer 28 and hard mask 18. In the example of hard mask 18 being nitride and sidewall spacer 28 being oxide, phosphoric acid is such an etchant. If a high K dielectric was deposited as the gate dielectric and would thus be on hard mask 18, a separate etchant for first removing the high k dielectric may be required before applying the etchant that removes hard mask 18 and leaves sidewall spacer 28. Semiconductor device 10 in FIG. 10 is a transistor with layer 16 on each side of gate 30 functioning as the source and drain. It would be preferable, however, for the source/drains to have a high doping region for subsequently forming a low resistance contact.

Figure 11:
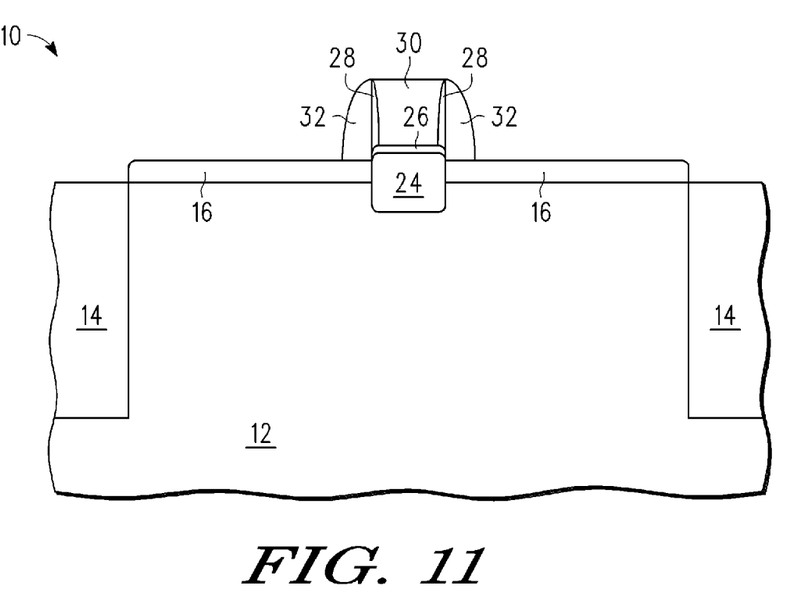
FIG. 11 is a cross section of the semiconductor device of FIG. 10 at a subsequent stage in processing.

Shown in FIG. 11 is semiconductor device 10 after forming sidewall spacer 32 around sidewall spacer 28 and thus around gate 30. Sidewall spacer 32 is for spacing the high doping concentration of the source/drains from the doping chosen at the interface with the channel. One possibility is to perform an implant to complete the formation of the source/drains by obtaining the high doping concentrations useful for making low resistance to contact. Another is continue with further embedded stress enhancements.

Figure 12:
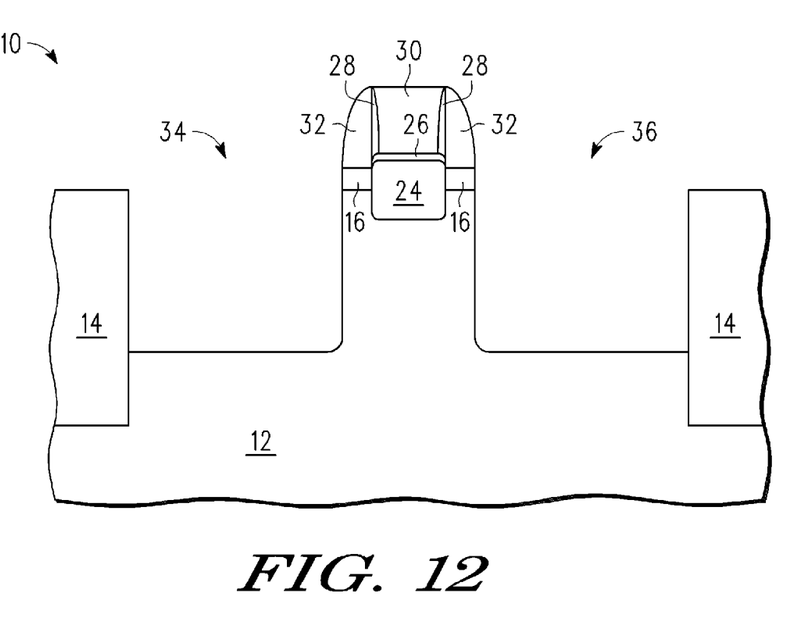
FIG. 12 is a cross section of the semiconductor device of FIG. 11 at a subsequent stage in processing.

Shown in FIG. 12 is semiconductor device 10 after forming recess 34 on one side of gate 30 and a recess 36 on the other side of gate 30 using sidewall spacer 32 as a mask. This leaves portions of silicon/carbon layer 16 as lightly doped source/drains in the area adjacent to the channel. Recesses 34 and 36 are about 2000 Angstroms deep as shown for a bulk silicon substrate. In the case of SOI, the recesses would leave at least a 100 Angstroms of silicon above the insulating layer.

Figure 13:
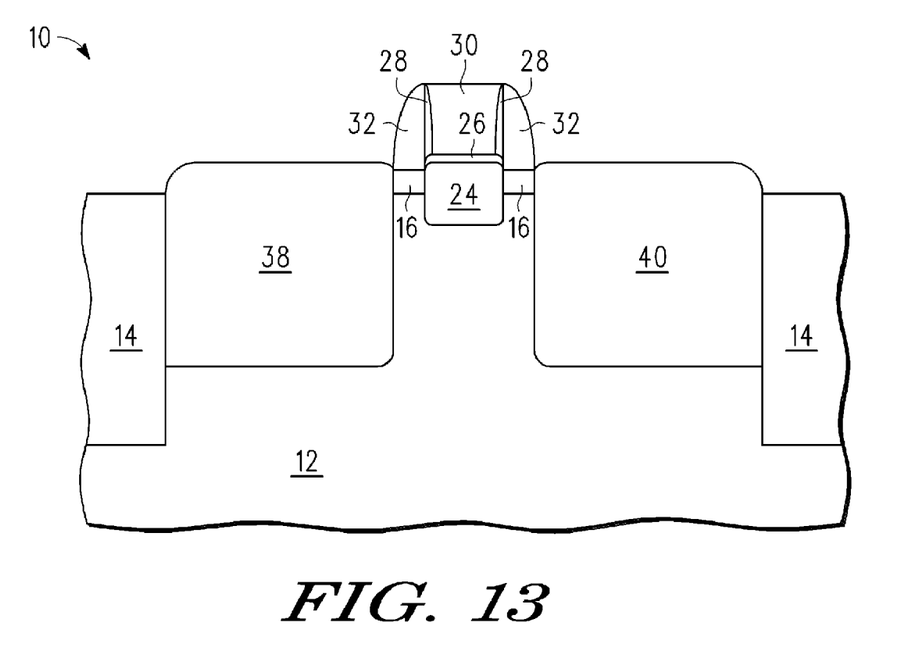
FIG. 13 is a cross section of the semiconductor device of FIG. 12 at a subsequent stage in processing.

Shown in FIG. 13 is semiconductor device 10 after forming heavily-doped source/drain regions 38 and 40 in recesses 34 and 36, respectively, by epitaxially growing silicon/carbon. They are preferably heavily-doped using arsenic or phosphorus or both during the epitaxial growth. This can also be characterized as source/drain regions being in-situ doped. Source/drain regions 38 and 40, being silicon/carbon, function as stressors that exert substantial tensile stress on the channel. There are then composite stressors that are made of heavily-doped source/drain regions 38 and 40 and silicon/carbon layer 16. The composite stressors are thus one and the same as the combined lightly-doped regions and the heavily-doped regions. The carbon concentration of 3% may be achieved for source/drain regions 38 and 40. There will be expected to be a higher defectivity rate along the interface of source/drain regions 38 and 40 with substrate 12 than the defectivity rate along the interface of silicon/carbon layer 16 with substrate 12. This is primarily because the epitaxial growth of source/drain regions 38 and 40 is along different planes and it is difficult if not impossible to optimize for different planes. It may be preferable to optimize epitaxial growth along the vertical sidewalls of recesses 34 and 36 rather than the horizontal (bottom) sidewalls because the bottom is further away from the channel so that the defects are likely to have a less adverse affect. Even defects along the vertical sidewall are less of a problem than those where silicon/carbon layer 16 is present in FIGS. 12 and 13.

Although the problems of defects along the interface between silicon and silicon/carbon are more severe than those between silicon and silicon/germanium, the described process may nonetheless be useful for silicon/germanium and forming P channel transistors. Germanium would be substituted for the carbon in silicon/carbon layer 16. Source/drain regions 38 and 40 would be grown as silicon/germanium source/drains and would be doped with boron. Tin is also a possible element to combine with silicon for use as an embedded stressor. Thus, silicon/carbon layer 16 and heavily-doped source/drains 38 and 40 are examples of materials that comprise silicon and one of a group consisting of carbon, germanium, and tin.

By now it should be appreciated that a semiconductor process has been provided. The process includes forming an epitaxial layer overlying a substrate, wherein there is a lattice mismatch between the epitaxial layer and the substrate. The process further includes forming a hard mask overlying the epitaxial layer, the hard mask having an opening. The process further includes forming a recess, substantially aligned to the opening in the hard mask, through the epitaxial layer and into the substrate. The process further includes forming a channel region of a semiconductor device in the recess. The process may further comprise forming trench isolation for the semiconductor device. The process may be further characterized by said step of forming trench isolation for the semiconductor device being performed before said step of forming the epitaxial layer. The process may be further characterized by said step of forming trench isolation for the semiconductor device being performed after said step of forming the epitaxial layer. The process may be further characterized by the epitaxial layer comprising silicon and one of a group consisting of carbon, germanium, and tin. The process may be further characterized by said step of forming a recess comprising etching through the epitaxial layer and into the substrate. The process may further comprise forming a gate stack in the recess, the gate stack overlying the channel region and forming an offset spacer along a sidewall in the recess. The process may be further characterized by the gate stack comprising at least one gate dielectric layer and at least one gate conductive layer. The process may be further characterized by the at least one gate conductive layer comprising at least one of a group consisting of metal and polysilicon. The process may be further characterized by said step of forming the channel region of the semiconductor device in the recess comprising epitaxially growing the channel region of the semiconductor device in the recess. The process may be further characterized by the channel region comprising silicon and one of a group consisting of carbon, germanium, and tin. The process may further comprise a source/drain region of the semiconductor device outside of the recess. The process may be further characterized by said step of forming the source/drain region of the semiconductor device outside of the recess comprising etching a portion of the epitaxial layer and the substrate located outside of the recess and epitaxially growing the source/drain region of the semiconductor device outside of the recess. The process may be further characterized by the source/drain region of the semiconductor device comprising silicon and one of a group consisting of carbon, germanium, and tin. The process may be further characterized by the epitaxial layer being doped with a first impurity having a first concentration and the source/drain region being doped with the first impurity having a second concentration, and wherein the first concentration and the second concentration are different. The process may be further characterized by the channel region is doped with a second impurity having a third concentration, wherein the second impurity is different than the first impurity, wherein the third concentration is different than the first concentration, and wherein the third concentration is different than the second concentration. The process may be further characterized by the doping of the epitaxial layer and the doping of the source/drain region are performed independently. The process may be further characterized by the semiconductor device comprising an NMOS transistor.

Also disclosed is a semiconductor fabrication process. The process includes forming a epitaxial layer overlying a substrate, wherein there is a lattice mismatch between the epitaxial layer and the substrate, and wherein the epitaxial layer is doped. The process further includes forming a hard mask overlying the epitaxial layer, the hard mask having an opening. The process further includes forming a recess, substantially aligned to the opening in the hard mask, through the epitaxial layer and into the substrate. The process further includes epitaxially growing a channel region in the recess. The process further includes forming a gate stack in the recess, the gate stack overlying the channel region. The process further includes removing the hard mask. The process further includes forming a sidewall spacer around the gate stack. The process further includes forming a source/drain region.

Also described is a semiconductor fabrication process. The process includes forming an epitaxial layer overlying a substrate, wherein there is a lattice mismatch between the epitaxial layer and the substrate. The process further includes forming a hard mask overlying the epitaxial layer, the hard mask having an opening. The process further includes forming a first recess, substantially aligned to the opening in the hard mask, through the epitaxial layer and into the substrate. The process further includes epitaxially growing a channel region in the first recess. The process further includes forming a gate stack in the first recess, the gate stack overlying the channel region. The process further includes removing the hard mask. The process further includes forming a sidewall spacer around the gate stack. The process further includes forming a second recess having a first sidewall substantially aligned to the sidewall spacer. The process further includes epitaxially growing a source/drain region in the second recess.

Although the invention is described herein with reference to specific embodiments, various modifications and changes can be made without departing from the scope of the present invention as set forth in the claims below. For example, sidewall spacer 28 formed while hard mask layer 18 was present but it could be formed after removal of hard mask layer 18 or even not formed. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A semiconductor fabrication process, comprising:
    forming an epitaxial layer overlying a substrate, wherein there is a lattice mismatch between the epitaxial layer and the substrate;
    forming a hard mask overlying the epitaxial layer, the hard mask having an opening;
    forming a recess, substantially aligned to the opening in the hard mask, through the epitaxial layer and into the substrate; and
    forming a channel region of a semiconductor device in the recess.

2. A process as in claim 1, further comprising:
    forming trench isolation for the semiconductor device.

3. A process as in claim 2, wherein said step of forming trench isolation for the semiconductor device is performed before said step of forming the epitaxial layer.

4. A process as in claim 2, wherein said step of forming trench isolation for the semiconductor device is performed after said step of forming the epitaxial layer.

5. A process as in claim 1, wherein the epitaxial layer comprises silicon and one of a group consisting of carbon, germanium, and tin.

6. A process as in claim 1, wherein said step of forming a recess comprises:
    etching through the epitaxial layer and into the substrate.

7. A process as in claim 1, further comprising:
    forming a gate stack in the recess, the gate stack overlying the channel region; and
    forming an offset spacer along a sidewall in the recess.

8. A process as in claim 7, wherein the gate stack comprises at least one gate dielectric layer and at least one gate conductive layer.

9. A process as in claim 8, wherein the at least one gate conductive layer comprises at least one of a group consisting of metal and polysilicon.

10. A process as in claim 1, wherein said step of forming the channel region of the semiconductor device in the recess comprises:
    epitaxially growing the channel region of the semiconductor device in the recess.

11. A process as in claim 10, wherein the channel region comprises silicon and one of a group consisting of carbon, germanium, and tin.

12. A process as in claim 1, further comprising:
    forming a source/drain region of the semiconductor device outside of the recess.

13. A process as in claim 12, wherein said step of forming the source/drain region of the semiconductor device outside of the recess comprises:
    etching a portion of the epitaxial layer and the substrate located outside of the recess; and
    epitaxially growing the source/drain region of the semiconductor device outside of the recess.

14. A process as in claim 12, wherein the source/drain region of the semiconductor device comprise silicon and one of a group consisting of carbon, germanium, and tin.

15. A process as in claim 12, wherein the epitaxial layer is doped with a first impurity having a first concentration and the source/drain region is doped with the first impurity having a second concentration, and wherein the first concentration and the second concentration are different.

16. A process as in claim 15, wherein the channel region is doped with a second impurity having a third concentration, wherein the second impurity is different than the first impurity, wherein the third concentration is different than the first concentration, and wherein the third concentration is different than the second concentration.

17. A process as in claim 12, wherein doping of the epitaxial layer and doping of the source/drain region are performed independently.

18. A process as in claim 12, wherein the semiconductor device comprises an NMOS transistor.

19. A semiconductor fabrication process, comprising:
    forming an epitaxial layer overlying a substrate, wherein there is a lattice mismatch between the epitaxial layer and the substrate, and wherein the epitaxial layer is doped;
    forming a hard mask overlying the epitaxial layer, the hard mask having an opening;
    forming a recess, substantially aligned to the opening in the hard mask, through the epitaxial layer and into the substrate;
    epitaxially growing a channel region in the recess;
    forming a gate stack in the recess, the gate stack overlying the channel region;
    removing the hard mask;
    forming a sidewall spacer around the gate stack; and
    forming a source/drain region.

20. A semiconductor fabrication process, comprising:
    forming an epitaxial layer overlying a substrate, wherein there is a lattice mismatch between the epitaxial layer and the substrate;
    forming a hard mask overlying the epitaxial layer, the hard mask having an opening;
    forming a first recess, substantially aligned to the opening in the hard mask, through the epitaxial layer and into the substrate;
    epitaxially growing a channel region in the first recess;
    forming a gate stack in the first recess, the gate stack overlying the channel region;
    removing the hard mask;
    forming a sidewall spacer around the gate stack;
    forming a second recess having a first sidewall substantially aligned to the sidewall spacer; and
    epitaxially growing a source/drain region in the second recess.

* * * * *